United States Patent
Tachimoto et al.

[11] Patent Number: 6,129,886
[45] Date of Patent: Oct. 10, 2000

[54] METHOD OF PREPARATION OF PIEZOELECTRIC CERAMICS

[75] Inventors: Kazushi Tachimoto; Mahoko Takada, both of Chiba; Kenji Horino, Akita; Kazuo Miyabe; Hitoshi Oka, both of Chiba, all of Japan

[73] Assignee: TDK Corporation, Tokyo, Japan

[21] Appl. No.: 09/048,900

[22] Filed: Mar. 27, 1998

[30] Foreign Application Priority Data

Mar. 31, 1997 [JP] Japan .................................. 9-096730

[51] Int. Cl.[7] .................................................. C04B 35/472
[52] U.S. Cl. .......................... 264/614; 264/618; 264/620; 264/674; 264/430
[58] Field of Search ..................... 264/674, 614, 264/620, 618, 430

[56] References Cited

U.S. PATENT DOCUMENTS 3,859,403  1/1975  Kahn ........................................ 264/260
5,225,126  7/1993  Alles et al. ............................... 264/620
5,759,480  6/1998  Hennings et al. .

FOREIGN PATENT DOCUMENTS 6-16473    6/1994  Japan .
9-162680   6/1997  Japan .

OTHER PUBLICATIONS

Kazushi Tachimoto, et al., Ferroelectric Applied Conference, No. 14, pp. 125–132, "Relationship Between Heat–Treatment Process and Piezoelectric Properties in Lead Titanate Ceramics", May 30, 1997, (With Concise Explanation).

*Primary Examiner*—James Derrington
*Attorney, Agent, or Firm*—Oblon, Spivak, McClelland, Maier & Neustadt, P.C.

[57] ABSTRACT

The object of the present invention is to realize the piezoelectric ceramics which, even when used as high frequency elements utilizing third harmonics wave of thickness longitudinal vibration, are small in temperature coefficient of resonant frequency and high in mechanical Q value and easy to correspond to the trend toward miniaturization and low voltage driving. When the piezoelectric ceramics with lead titanate as its main component are manufactured in order to achieve this object, it was decided that the piezoelectric ceramics be manufactured by the manufacturing method, wherein a heat treatment is performed between a firing process and a polarization process in the atmosphere of oxygen partial pressure less than the oxygen partial pressure of the atmospheric pressure at temperatures more than 500° C. and not more than the firing temperatures.

14 Claims, 3 Drawing Sheets

METHOD OF PREPARATION OF PIEZOELECTRIC CERAMICS

BACKGROUND OF THE INVENTION

1. Technical Field of the Invention

The present invention relates to a manufacturing method of piezoelectric ceramic materials useful for a ceramic resonator, a ceramic filter, a surface acoustic wave element, a piezoelectric displacement element, an ultrasonic transducer or the like, and more particularly to a manufacturing method of piezoelectric ceramic material which is preferred for piezoelectric element for high frequency use, utilizing third harmonic wave of thickness longitudinal vibration and high in machine quality coefficient.

2. Related Art

In recent years, piezoelectric element is widely used in the ceramic resonator, the ceramic filter, the surface acoustic wave element, the piezoelectric displacement element, the ultrasonic transducer, etc. and the range of its use is more and more increasing. On the other hand, the required characteristics includes many things and becomes most severe.

In recent years, especially with the advancement of more higher frequency use of the piezoelectric element, the material which is excellent not only in piezoelectric characteristics but also in dielectric characteristics is in strong demand. For example, as the material for the surface acoustic wave element, strongly desired is the material which is large in electromechanical coupling coefficient and small in temperature coefficient of surface wave speed (or delay time) and moreover which has characteristics, wherein dielectric constant is small because of use in high frequency of 10 MHz or more.

Now, as the piezoelectric materials for the surface acoustic wave element, $LiNbO_3$ single crystal, $LiTaO_3$ single crystal, ZnO thin film, piezoelectric ceramics, etc. are known so far, among which the piezoelectric ceramics are advantageous from a cost point of view and characteristics thereof can be diversified by changing the composition. Particularly, among those materials, PZT group materials have been vigorously developed so far, which are preferred in piezoelectric characteristics and temperature characteristics.

As the PZT group materials, those materials which have lead zirconate titanate as its main component and are added with metallic oxides such as Mn, Cr, Co, Fe, etc. or those materials which make the composite oxides as represented by $Pb(Mg_{1/3}Nb_{2/3})O_3$ into solid solution and various physical properties thereof improved are known. However, these materials are not suitable for the piezoelectric element for high frequency because dielectric constant tends to become high if temperature characteristics is improved in general. Therefore, various studies are being conducted on the composition group having a smaller dielectric constant as surface wave element. Yet, no materials have been found so far wherein effective dielectric constant is not more than 350. In the conventional PZT materials, if they were used in high frequency range, significant disadvantages followed where input-output impedance decreases and impedance mismatching is generated between the external circuit and them or a capacity coupling is established between the input and the output, etc., thereby causing ripple to the output waveform.

On the other hand, lead titanate group materials containing rare earth group materials and other metallic oxides at the same time are also proposed as the piezoelectric elements for high frequency. However, these materials are low in dielectric constant, comparing to the PZT group materials and, though good in piezoelectric characteristics, they are inferior in a sintering property and difficult to make large sized ceramics. Moreover, a polarization condition is severe and there is a disadvantage in that a yield in mass production is low.

As the materials which overcame the disadvantages of the conventional piezoelectric element materials and which have low dielectric constant and high mechanical quality coefficient (mechanical Q value: Qm value), those materials which have lead titanate, bismuth titanate and calcium titanate as the basic constitutional components but which are substituted titanium by manganese or niobium are proposed (Japanese Patent Application Kokai No. 191055/1985). However, in case where they are used as high frequency resonators utilizing third harmonic wave of thickness longitudinal vibration, there arise disadvantages in that excellent physical properties of the materials peculiar to these materials such as small temperature coefficient of resonance frequency (TCF) and high machine Q value can not be fully displayed.

In case where the piezoelectric elements are used as high frequency elements utilizing third harmonic wave of thickness longitudinal vibration, as an experiment to make temperature coefficient of resonance frequency small and mechanical Q value high, there are, for example, the piezoelectric ceramics which are described in Japanese Patent Application Kokai No. 58724/1993 and Japanese Patent Application No. 353674/1993.

However, these piezoelectric elements are unable to correspond to the trend toward miniaturization and low-voltage driving. That is to say, for example, in case of ceramics oscillator for hard-disc driving, there is a need to realize frequency more than 40 MHz in a shape not more than 40 mm square and yet it is difficult for the piezoelectric ceramics with lead titanate as a main component as described in said Japanese Patent Application Kokai No. 58724/1993 or Japanese Patent Application No. 353674/1993 to correspond to such a need since mechanical quality coefficient (Qm) is not good enough in high frequency range.

SUMMARY OF THE INVENTION

The object of the present invention is to provide the piezoelectric ceramics which are, even if used as high frequency elements utilizing third harmonic wave of thickness longitudinal vibration, small in temperature coefficient of resonance frequency and high in mechanical Q value and easy to correspond to the trend toward miniaturization and low-voltage driving constitution.

The above object can be achieved by the formulae from (1) to (10) as described as follows:

(1) A method of preparation of piezoelectric ceramics; wherein a heat treatment is performed, when the piezoelectric ceramics with lead titanate as a main component are manufactured, between a firing process and a polarization process at temperatures of more than 500° C. and not more than firing temperature under the atmosphere of oxygen partial pressure less than the oxygen partial pressure of the atmospheric pressure.

(2) A method of preparation of piezoelectric ceramics; wherein a temperature lowering step on performing a firing process, when the piezoelectric ceramics with lead titanate as the main component are manufactured, is processed under the atmosphere of oxygen partial pressure less than the oxygen partial pressure of the atmospheric pressure.

(3) The method of preparation of piezoelectric ceramics as claimed in (1): wherein, when said piezoelectric ceramics are represented by (1-a) [Pb$_x$TiO$_3$]+a[Me$_y$TiO$_3$] (Me is one kind or more than one kind of metals among Ca, Sr and Ba), $0.95 \leq x \leq 1.02$ $0.95 \leq y < 1.02$ $0.01 \leq a \leq 0.35$ (4) The method of preparation of piezoelectric ceramics as claimed in (2): wherein, when said piezoelectric ceramics are represented by (1-a) [Pb$_x$TiO$_3$]+a[Me$_y$TiO$_3$] (Me is one kind or more than one kind of metals among Ca, Sr and Ba), $0.95 \leq x \leq 1.02$ $0.95 \leq y \leq 1.02$ $0.01 \leq a \leq 0.35$ (5) The method of preparation of piezoelectric ceramics as claimed in (1): wherein, when said piezoelectric ceramics are represented by (1-a-b) [Pb$_x$TiO$_3$]+a[Me$_y$TiO$_3$]+b[Bi$_{2/3}$zTiO$_3$] (Me is one kind or more than one kind of metals among Ca, Sr and Ba), $0.95 \leq x \leq 1.02$ $0.95 \leq y \leq 1.02$ $0.95 \leq z \leq 1.02$ $0.01 \leq (a+b) \leq 0.35$ $0 < b \leq 0.30$ (6) The method of preparation of piezoelectric ceramics as claimed in (2): wherein, when said piezoelectric ceramics are represented by (1-a-b) [Pb$_x$TiO$_3$]+a[Me$_y$TiO$_3$]+b[Bi$_{2/3}$zTiO$_3$] (Me is one kind or more than one kind of metals among Ca, Sr and Ba), $0.95 \leq x \leq 1.02$ $0.95 \leq y \leq 1.02$ $0.95 \leq z \leq 1.02$ $0.01 \leq (a+b) \leq 0.35$ $0 < b \leq 0.30$ (7) The method of preparation of piezoelectric ceramics as claimed in (3), wherein a part of the Ti in said basic composition is substituted by Mn and/or Nb not more than 10 at %.

(8) The method of preparation of piezoelectric ceramics as claimed in (5), wherein a part of the Ti in said basic composition is substituted by Mn and/or Nb not more than 10 at %.

(9) The method of preparation of piezoelectric ceramics as claimed in (3), wherein a part of the Pb in said basic composition is substituted by one kind or more than one kind among rare earth elements not more than 20 at %.

(10) The method of preparation of piezoelectric ceramics as claimed in (5), wherein a part of the Pb in said basic composition is substituted by one kind or more than one kind among rare earth elements not more than 20 at %.

FUNCTION

In case of the piezoelectric ceramics, the manufacturing process such as work processing after firing, polarization, and the like will exert a great influence upon the characteristics. However, there still remain a lot of unexplained points in relation to each of its main causes and effect thereof upon the piezoelectric characteristics. For example, a sharp improvement of the piezoelectric characteristics by means of process control as described in Japanese Patent Application Kokai No. 202291/1995, high temperature polarization method, etc. is known and, as clearly shown by these examples, there exists a close relationship between heat background and the characteristics after polarization. Yet, these methods can be used profitably to improve the characteristics. As a part of these methods, the present invention has a process, wherein a heat treatment is executed between a firing process and a polarization process in oxygen partial pressure less than the oxygen partial pressure of the atmospheric pressure at temperatures not less than 500° C. and not more than the firing temperatures, thereby finding that machine quality coefficient Qm is remarkably improved, coming to make the present invention. The heat treatment may be used both as temperature lowering step and the heat treatment by controlling through the ambient atmosphere the temperature lowering step when firing.

DESCRIPTION OF THE PREFERRED EMBODIMENTS

Figure 1:
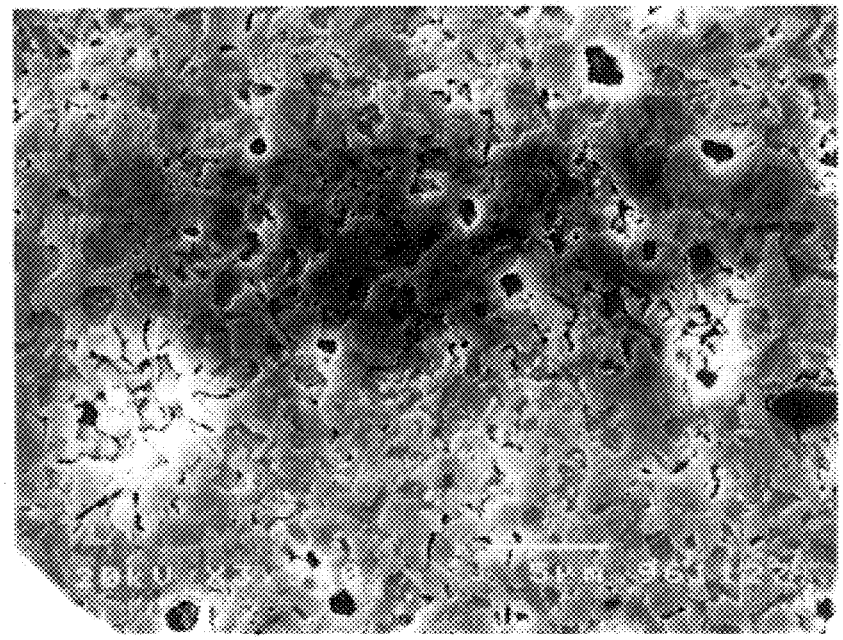
FIG. 1 is a SEM (Scanning Electron Microscope) photograph, showing the surface of a sample treated with a heat treatment under the nitrogen atmosphere.

The manufacturing method of the piezoelectric ceramics of the present invention has a process, wherein a heat treatment is made between a firing process and a polarization process of the piezoelectric ceramics with lead titanate as a main component under oxygen partial pressure less than the oxygen partial pressure of the atmospheric pressure at temperatures not less than 500° C. and not more than the firing temperatures. In this way, by executing the heat treatment after the firing process and before the polarization process under oxygen partial pressure less than the oxygen partial pressure of the atmospheric pressure at temperatures not more than 500° C. and not more than the firing temperatures, the machine quality coefficient Qm is remarkably improved.

The piezoelectric ceramics used for the present invention are composed of lead titanate as a main component. By using the piezoelectric ceramics of lead titanate group, it is made possible to use the third higher harmonics, thereby miniaturization and high frequency function may be achieved. If the piezoelectric ceramics according to the present invention are composed of lead titanate as a main component, there is no restriction imposed thereon, but it is preferable to have the basic composition (1) as represented by (1-a) [Pb$_x$TiO$_3$]+a[Me$_y$TiO$_3$] (Me is one kind or more than one kind of metals among Ca, Sr and Ba, x is 0.95 to 1.02, y is 0.95 to 1.02 and a is 0.01 to 0.35), or the basic composition (2) as represented by (1-a-b) [Pb$_x$TiO$_3$]+a[Me$_y$TiO$_3$]+b[Bi$_{2/3}$zTiO$_3$] (Me is one kind or more than one kind of metals from among Ca, Sr and Ba, x is 0.95 to 1.02, y is 0.95 to 1.02, z is 0.95 to 1.02, a+b is 0.01 to 0.35 and b is up to 0.30).

The piezoelectric ceramics preferably used for the present invention and having said compositions (1) and (2) contain lead titanate and either one kind of calcium titanate, strontium titanate and barium titanate. In addition to this, the composition (2) has bismuth titanate. Mole ratio a contained in the total amount of calcium titanate, strontium titanate and barium titanate in these composite matters is preferable to be within the range of a=0.01 to 0.35 and more preferably, within the range of a=0.01 to 0.3

In case the Me is strontium or barium, when mole ratio a is less than 0.01, improvement of mechanical quality Q value tends to become difficult. In case of calcium, when mole ratio is less than 0.01, piezoelectric characteristics and temperature characteristics tend to decrease. In case of strontium and barium, when mole ratio a exceeds 0.35, piezoelectric characteristics tend to deteriorate. In case of calcium, when mole ratio a exceeds 0.35, there are some cases when dielectric constant often tends to exceed 300 and application to high frequency tend to become difficult.

The content b of bismuth titanate to all composite matters in the basic composition is preferable to be within the range of $b \leq 0.30$ particularly b=0.001 to 0.30 and more preferably to be within the range of b=0.005 to 0.20

When mole ratio b of bismuth titanate is taken not less than 0.001, a degree of sintering is improved and deformation of the element body disappears. When mole ratio b of bismuth titanate exceeds 0.30, some cases arise where foreign materials tend to be deposited in grain boundary and piezoelectric characteristics tend to be damaged.

Pb atomic ratio in lead titanate is usually 1, but there are cases when it fluctuates to a certain extent depending on the amount of Pb supplied compositions in raw materials or on differences in the firing conditions. The fluctuation amount x in this case is preferable to be within the range of preferably x=0.95 to 1.02.

If the x is less than 0.95, piezoelectric characteristics tends to deteriorate and, if the x exceeds 1.02, a degree of sintering tends to decrease. However, if the x is kept within the above mentioned range, the amount less than 1 has less tendency to deteriorate and is much preferable.

Also, as the fluctuation amounts y and z of calcium titanate, strontium titanate, barium titanate and bismuth titanate, all of which are added to lead titanate, y=0.95 to 1.02, z=0.95 to 1.02 are within the preferable range. If y and z are less than 0.95, piezoelectric characteristics tends to deteriorate. Again, if y and z exceed 1.02. a degree of sintering tends to decrease.

Further, in the present invention, a part of the Ti may be substituted by Mn and/or Nb with the total amount up to 10 at %, particularly 0.05 to 10 at %. If the amount of Mn and Nb is not less than 0.05 at %, breakdown during polarization diminishes sharply. Again, if the amount exceeds 10 at %, there arise cases where the degree of sintering tends to decrease or electric resistance tends to decrease, thereby making no polarization possible. These substituted amounts are preferable to be kept within 0.05 to 5 at % in total, but if two kinds are used together, a ratio of the amount can be decided optionally.

Furthermore in the present invention, a part of the Pb may be substituted by one kind or more than one kind of rare earth elements. As the rare earth elements, one kind or more than one kind of lanthanoid group elements are particularly preferable. Most preferable are La, Ce, Pr, Nd, Pm, Sm, Eu, Gd, Tb, Dy, Ho, Er, Tm, Yb, Lu, etc., particularly one kind or more than one kind of La, Ce, Nd and Sm with substitution amount up to 30 at %, especially 0.5 to 15 at %. These compounds usually exist in stoichiometry compositions, but may be allowed to deviate a few from the amount concerned.

Next, the manufacturing method of the piezoelectric ceramics according to the present invention will be described in details as follows.

First, as the starting raw materials, PbO, $TiO_3$, $Bi_2O_3$, $CaCO_3$, $SrCO_3$, $BaCO_3$, $MnO_2$, $Nb_2O_5$, $La_2O_3$, etc. are employed and weighed so that the final compositions may become the piezoelectric ceramics of lead titanate group, preferably the above mentioned compositions. After being thoroughly mixed by a ball mill, the raw materials are calcined for about 1 to 3 hours at about 800 to 1000° C. The obtained calcined materials are pulverized, for example, by the ball mill. The average particle grain diameter of the calcined materials at this time is preferable to be about 0.8 to 2 $\mu$m. Next, by using a mold, etc., they are molded into a necessary shape, for example, a temporary shape with thickness of about 0.5 to 20 mm by uniaxial pressure of 10 to 1000 kg/cm². After that, they are properly molded into shape preferably by pressurizing with hydrostatic pressure of, for example, 500 to 5000 kg/cm². The molded body is fired or sintered at holding temperatures within the range of preferably 1000 to 1400° C. or more preferably about 1150 to 1250° C. preferably for 1 to 16 hours, particularly for about 3 to 5 hours, thereby manufacturing the piezoelectric ceramics elements. There is no restriction imposed on both the temperature rising speed and the temperature lowering speed at this time, but the range of about 200 to 300° C./h is just preferable.

The obtained piezoelectric ceramics elements are sliced into the necessary size with slicing work, etc. Then they are treated with polishing, after which the piezoelectric ceramics substrates of the given size are obtained. These substrates are treated with heat treatment by using, for example, a tube furnace by using, for example, gas with oxygen, nitrogen, carbon, hydrogen, etc. as its main components so as to become oxygen partial pressure less than the oxygen partial pressure of the atmospheric pressure or by flowing these mixed gases, or these mixed gasses added with inert gas and so on or preferably nitrogen gas, oxygen gas or mixed gasses of the nitrogen and oxygen gasses as the atmosphere gas.

The oxygen partial pressure of the atmosphere is preferable to be less than the oxygen partial pressure of the atmospheric air. That is to say, the oxygen concentration is preferable to be less than 20%, particularly preferable to be 0 to 18%. The flow rate of the atmospheric gas is not particularly regulated, but it is preferable to be 0.1 to 50 liter/min and more preferably to be within the range of 0.5 to 5 liter/min. The heating conditions at this time are more than 500° C. and not more than the firing temperatures, preferably to be 600 to 1000° C., particularly to be heated at 700 to 900° C. and preferably to be kept at those temperatures for 0.5 to 3 hours. There is no restriction imposed on both the temperature rising speed and the temperature lowering speed, but the range of about 200 to 300° C./h is just preferable.

This heat treatment process may be treated as a separate process as described above, but the temperature lowering step of the firing process of the piezoelectric ceramics in the oxygen partial pressure less than the atmospheric partial pressure may be processed in the atmosphere of the oxygen partial pressure less than the oxygen partial pressure of the atmospheric partial pressure. In this case, the temperature lowering speed is preferable to be about 200 to 300° C./h and the same effect can be obtained as described above even when the piezoelectric ceramics substrates are processed in the conditions of this sort.

Furthermore, the obtained piezoelectric ceramics substrates processed with heat treatment are impressed with electric field of about 1 to 10 Kv/mm preferably at 80 to 150° C., for example, in a silicon oil vessel and treated with polarization processing, thereby obtaining the piezoelectric ceramics elements. After that, silver electrodes, for example, are installed on both faces if needs and the required elements are manufactured accordingly.

Figure 5:
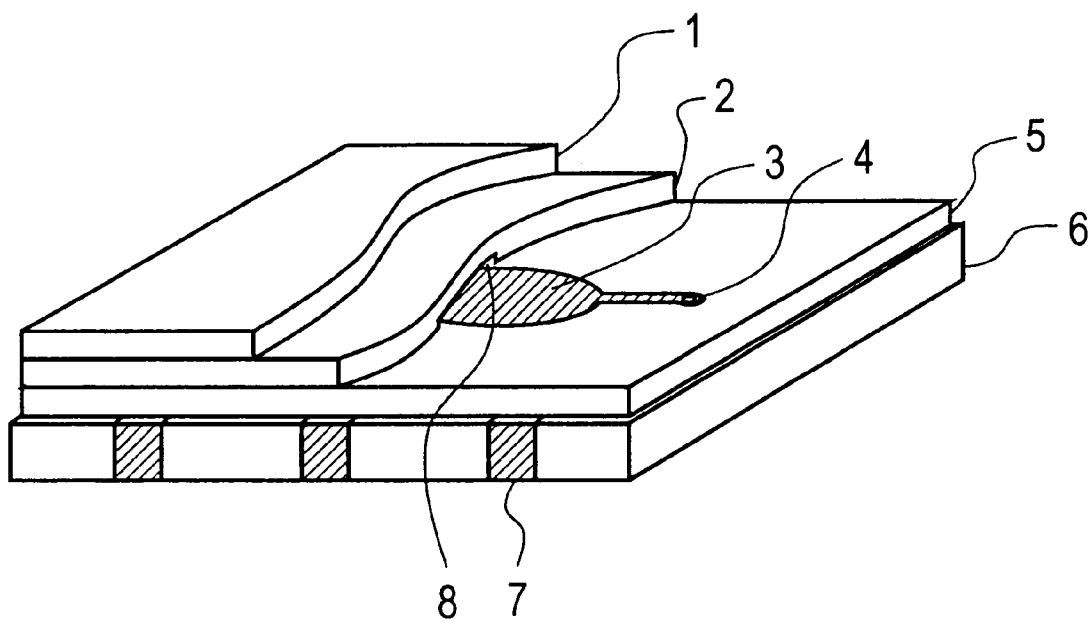
FIG. 5 is a schematic structural diagram, showing one example of a resonator using the piezoelectric element manufactured according to the method of the present invention.

The piezoelectric elements of this sort are preferable for the ceramic resonator, the ceramic filter, the surface acoustic wave element, piezoelectric displacement element, the supersonic wave resonator, etc. For example, when the piezoelectric elements of this sort are made into resonators, such resonators may be composed of a reinforcing plate 1, a resin layer 2, an internal electrode 3, a through hole 4, a piezoelectric element 5, a dielectric base plate 6, an edge electrode 7 and a cavity 8, as shown in FIG. 5.

PREFERRED EMBODIMENTS OF THE INVENTION

Next, examples will be described as follows, wherein the present invention will be described more concretely.

EXAMPLE 1

As the starting raw materials, PbO, $TiO_2$, $Bi_2O_3$, $CaCO_3$, $SrCO_3$, $BaCO_3$, $MnO_2$, $Nb_2O_5$ and $La_2O_3$ were employed. For the basic composition of the final composition: 0.69 $[PbTiO_3]+0.3[MeTiO_3]+0.01[Bi_{2/3}TiO]$, a sample added with Mn=0.1 at %, Nb=0.1 at % was prepared.

In other words, the raw materials were weighed and after being mixed thoroughly by a ball mill, were calcined at 900° C. for 2 hours and pulverized by the ball mill the calcined products obtained. Then, after being temporarily molded into shape of about 1 cm thickness by a 40 mm square mold under uniaxial pressure of 200 $kg/cm^2$, they were properly molded into shape under pressure of 2500 $kg/cm^2$ by using a hydrostatic pressure press device The compact was fired at temperatures within the range of 1150 to 1250° C. for 4 hours and the piezoelectric ceramics were manufactured accordingly.

The obtained piezoelectric ceramics were processed with a slicing work and then polished by a lapping machine and the piezoelectric ceramics substrates of 0.24 mm thickness were obtained. After that, these substrates were processed with heat treatment by using a tube furnace of 150 mm φ at temperatures of 800° C. for one hour in a flowing state of nitrogen gas, oxygen gas or the atmospheric air at 2 liter/min. Samples without heat treatment were also prepared.

Each of the obtained samples was processed with polarization treatment in a silicon oil vessel applied with electric field of 120° C.·5 Kv/mm. After that, it was made into a sample for measuring electric characteristics by installing silver electrodes of 1 mm φ on both faces. Regarding these samples, the piezoelectric characteristics was measured by the standard circuit of I.R.E in a third harmonic wave mode of thickness longitudinal vibration. Also, after the polarization, a heat deterioration test was conducted in the condition of temperatures at 240° C. for 30 seconds.

On frequency constant, about 30 Hzm higher value was obtained in case of samples of nitrogen atmosphere, comparing to those samples of the oxygen atmosphere and the atmospheric air without heat treatment. On resonant resistance, nearly 4 Ω lower value was obtained in case of samples of the nitrogen atmosphere, comparing to those samples of the oxygen atmosphere and the atmospheric air. On relative dielectric constant, no remarkable difference was noticed even in samples of the nitrogen atmosphere, comparing to those samples of the oxygen atmosphere and the atmospheric air. On value of direct current resistance, about $0.5 \times 10^{11}$ Ω higher value was obtained in case of samples of the nitrogen atmosphere, comparing to those samples of the oxygen atmosphere and the atmospheric air. Further, in the heat deterioration test, about +0.35% higher value of resonant frequency was obtained in case of samples of the nitrogen atmosphere, comparing to those samples of the oxygen atmosphere and the atmospheric air. From the above, it was confirmed that samples processed with the heat treatment in the nitrogen atmosphere have heat resistance too. It was also confirmed that, when a fluctuation of the oxygen concentration inside the furnace under the nitrogen atmosphere was measured, the oxygen concentration increased in case where samples were put in and oxygen was released from the samples.

EXAMPLE 2

The samples which were processed without heat treatment and processed with heat treatment under the nitrogen atmosphere at 850° C. for 1 hour in the example 1 were prepared similarly with the example 1.

Figure 2:
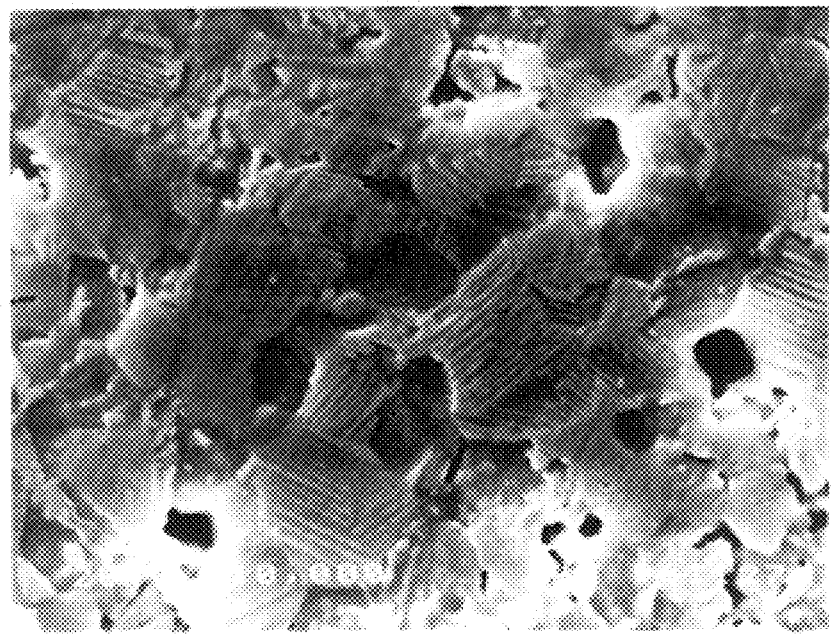
FIG. 2 is a magnified photograph of the FIG. 1.
Figure 3:
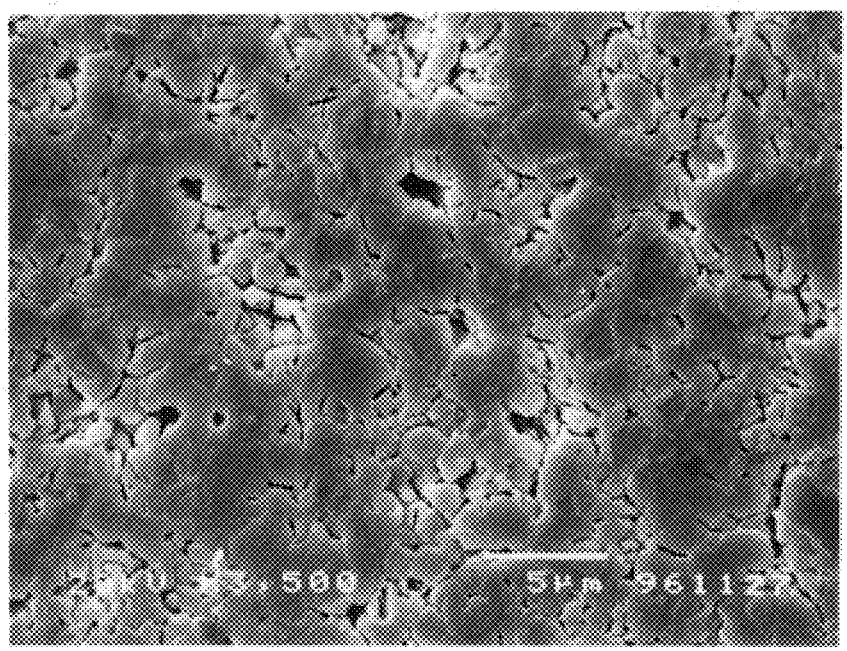
FIG. 3 is a SEM showing the surface of a sample not treated with the heat treatment.
Figure 4:
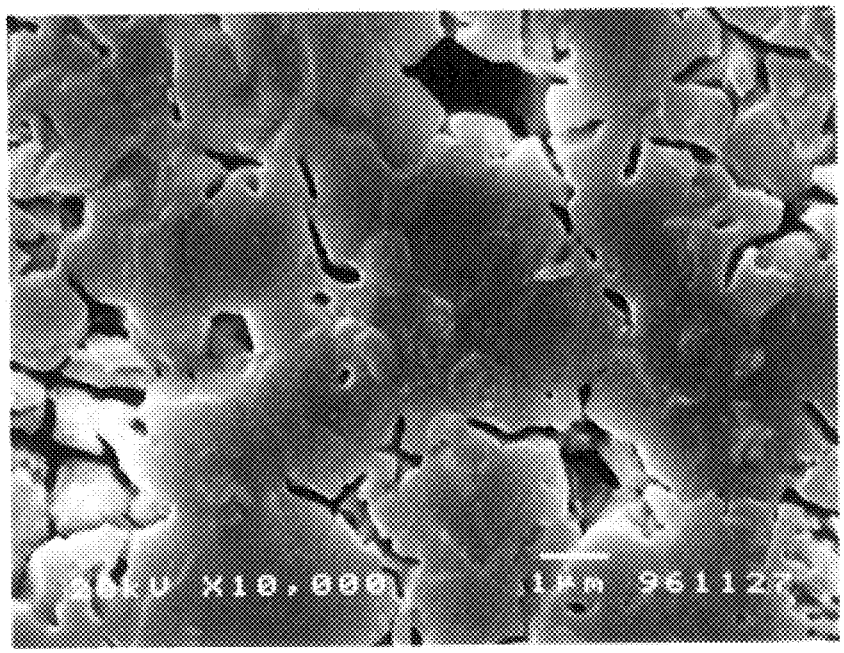
FIG. 4 is a magnified photograph of the FIG. 3.

The surface of the obtained samples was polished into a mirror finished surface, applied with a chemical etching by using HF aqueous solution and observed by SEM. The obtained results are shown in FIGS. 1 to 4. Now, FIG. 1 shows the sample processed under the nitrogen atmosphere. FIG. 2 shows an enlarged view of the FIG. 1. FIG. 3 shows the sample processed with no heat treatment and FIG. 4 shows a enlarged view of the FIG. 3. As shown clearly by the drawings, it can be confirmed that the samples processed with the heat treatment under the nitrogen atmosphere have stripped patterns which appear to be domains and the domains are expected to be much stable.

EXAMPLE 3

As the starting raw materials, PbO, $TiO_2$, $Bi_2O_3$, $CaCO_3$, $SrCO_3$, $MnO_2$, $Nb_2O_5$, and $La_2O_3$ were employed and weighed so that the final composition becomes the composition as shown in Table 1. Then, after being mixed thoroughly by a ball mill, they were calcined at 900° C. for 2 hours. The calcined matters obtained were pulverized by the ball mill. Next, after being temporarily molded into shape of about 1 cm thickness by a 40 mm square mold under uniaxial pressure of 200 $kg/cm^2$, they were properly molded into shape by a hydrostatic pressure press device under pressure of 2500 $kg/cm^2$. The compact was fired at temperatures within the range of 1150 to 1250° C. for 4 hours and the piezoelectric ceramics were manufactured accordingly.

The obtained piezoelectric ceramics were made with a slicing work and then polished by a lapping machine and the piezoelectric ceramics substrates of 0.24 mm thickness were obtained. After that, these substrates were processed with heat treatment by using a tube furnace of 150 mm φ in a flowing state of nitrogen gas, oxygen gas or mixed gases of nitrogen and oxygen at 2 liter/min. Also, samples without heat treatment were prepared, which are out of the scope of the present invention.

Each of the obtained samples was processed with polarization treatment in a silicon oil vessel applied with electric field of 120° C.·5 Kv/mm. After that, it was made into a sample for measuring electric characteristics by installing silver electrodes on both faces. On these samples, machine quality coefficient (Qm), Resonant Impedance (RO), Coefficient of machine coupling (Kt), or the like were measured and the obtained results are shown in Table 1.

thickness longitudinal vibration, in temperature coefficient of resonant frequency and high in mechanical quality value and easy to correspond to the trend toward miniaturization and low voltage driving can be materialized.

TABLE 1

| Sample No. | Composition | | | | Heat treatment temperature (° C.) | Heat treatment time (h) | Heat treatment atmosphere $O_2:N_2$ | Electric characteristics | | |
|---|---|---|---|---|---|---|---|---|---|---|
| | MeTiO$_3$ (mol %) | Bi$_{2/3}$TiO$_3$ (mol %) | Mn Substitution amount (at %) | Nb Substitution amount (at %) | Rare earth substitution amount (at %) | | | | Qm | RO (Ω) | Kt (%) |
| 1* | Sr 30 | 0.01 | 0.1 | 0.1 | La — | —* | — | — | 3985 | 11.4 | 10.5 |
| 2* | Sr 30 | 0.01 | 0.1 | 0.1 | La — | 800 | 1 | 100:0* | 3971 | 11.4 | 10.4 |
| 3* | Sr 30 | 0.01 | 0.1 | 0.1 | La — | 800 | 1 | 25:75* | 3993 | 11.4 | 10.5 |
| 4 | Sr 30 | 0.01 | 0.1 | 0.1 | La — | 800 | 1 | 15:85 | 4350 | 10.6 | 10.5 |
| 5 | Sr 30 | 0.01 | 0.1 | 0.1 | La — | 800 | 1 | 0:100 | 5011 | 9.7 | 10.6 |
| 6 | Sr 30 | 0.01 | 0.1 | 0.1 | La — | 800 | 1 | 0:100 | 4850 | 10.0 | 10.6 |
| 7 | Sr 30 | 0.01 | 0.1 | 0.1 | La — | 900 | 1 | 0:100 | 5120 | 9.3 | 10.6 |
| 8 | Sr 30 | 0.01 | 0.1 | 0.1 | La — | 700 | 1 | 0:100 | 4985 | 9.9 | 10.5 |
| 9* | Sr 30 | 0.01 | 0.1 | 0.1 | La — | 500* | 1 | 1:100 | 3950 | 11.6 | 10.4 |
| 10* | Sr 15 | 0.01 | 0.1 | 0.1 | La 10 | —* | — | — | 4400 | 8.9 | 11.0 |
| 11 | Sr 15 | 0.01 | 0.1 | 0.1 | La 10 | 800 | 1 | 0:100 | 5220 | 7.4 | 11.1 |
| 12* | Ca15 + Sr15 | 0.01 | 0.1 | 0.1 | La — | —* | — | — | 2930 | 17.6 | 11.6 |
| 13 | Ca15 + Sr15 | 0.01 | 0.1 | 0.1 | La — | 800 | 1 | 0:100 | 3110 | 15.7 | 11.9 |

*is beyond its scope of the invention

As clearly shown by the Table 1, it is clear that the samples processed with heat treatment according to the present invention are remarkably improved in mechanical quality coefficient, comparing to those samples without heat treatment or those samples which are out of the scope of the present invention.

EXAMPLE 4

In the composition of the samples 4 and 11 of the example 3, no particular heat treatment process was set up, but at the temperature lowering step of the firing process, the temperature lowering process was made under a flowing state of nitrogen gas at 2 liter/min.

On each of the obtained samples, the same assessment as the example 1 was performed and almost the same results were obtained.

EXAMPLE 5

By using the same piezoelectric elements as the samples No. 4 to 8 and 11 which were obtained in the example 3, resonators such as shown in FIG. 5 were prepared and it was confirmed that excellent characteristics as resonators can be obtained.

EXAMPLE 6

In the example 1, rare earth elements to be substituted were replaced by Ce, Pr, Nd, Pm, Sm, Eu, Gd, Tb, Dy, Ho, Er, Tm, Yb and Lu instead of La and the rest remained the same with the example 1, on the basis of which each sample was prepared. The obtained results turned out to be almost the same with the example 1.

EFFECT

According to the present invention as described above, the piezoelectric ceramics which are small, even when used as high frequency elements utilizing third harmonic wave of

What is claimed is:

1. A method of preparation of piezoelectric ceramics; comprising heat treating piezoelectric ceramics comprising lead titanate and a titanate of Ca, Sr, Ba or a mixture thereof as a main component after a firing process and before a polarization process at a temperature of more than 500° C. and not more than the firing temperature under an atmosphere of nitrogen or an atmosphere of nitrogen and oxygen, wherein the oxygen concentration is 18% or less.

2. A method of preparation of piezoelectric ceramics; comprising after firing lowering the temperature of piezoelectric ceramics comprising lead titanate and a titanate of Ca, Sr, Ba or a mixture thereof as the main component under an atmosphere of nitrogen or an atmosphere of nitrogen and oxygen, wherein the oxygen concentration is 18% or less.

3. The method of preparation of piezoelectric ceramics as claimed in claim 1: wherein, when said piezoelectric ceramics are represented by (1-a) [Pb$_x$TiO$_3$]+a[Me$_y$TiO$_3$] (Me is one kind or more than one kind of metals among Ca, Sr and Ba), $0.95 \leq x \leq 1.02$
$0.95 \leq y \leq 1.02$
$0.01 \leq a \leq 0.35$.

4. The method of preparation of piezoelectric ceramics as claimed in claim 2: wherein, when said piezoelectric ceramics are represented by (1-a) [Pb$_x$TiO$_3$]+a[Me$_y$TiO$_3$] (Me is one kind or more than one kind of metals among Ca, Sr and Ba), $0.95 \leq x \leq 1.02$
$0.95 \leq y \leq 1.02$
$0.01 \leq a \leq 0.35$.

5. The method of preparation of piezoelectric ceramics as claimed in claim 1: wherein, when said piezoelectric ceramics are represented by (1-a-b) [Pb$_x$TiO$_3$]+a[Me$_y$TiO$_3$]+b[Bi$_{2/3}$zTiO$_3$] (Me is one kind or more than one kind of metals among Ca, Sr and Ba), $0.95 \leq x \leq 1.02$
$0.95 \leq y \leq 1.02$
$0.95 \leq z \leq 1.02$ $0.01 \leq (a+b) \leq 0.35$ $0 < b \leq 0.30$.

6. The method of preparation of piezoelectric ceramics as claimed in claim 2: wherein, when said piezoelectric ceramics are represented by $(1-a-b)[Pb_xTiO_3]+a[Me_yTiO_3]+b[Bi_{2/3}zTiO_3]$ (Me is one kind or more than one kind of metals among Ca, Sr and Ba), $0.95 \leq x \leq 1.02$ $0.95 \leq y \leq 1.02$ $0.95 \leq z \leq 1.02$ $0.01 \leq (a+b) \leq 0.35$ $0 < b \leq 0.30$.

7. The method of preparation of piezoelectric ceramics as claimed in claim 3, wherein not more than 10 at % of the Ti in said piezoelectric ceramics is substituted by at least one selected from the group consisting of Mn, and Nb, and a mixture thereof.

8. The method of preparation of piezoelectric ceramics as claimed in claim 5, wherein not more than 10 at % of the Ti in said piezoelectric ceramics is substituted by at least one selected from the group consisting of Mn, and Nb, and a mixture thereof.

9. The method of preparation of piezoelectric ceramics as claimed in claim 3, wherein not more than 20 at % of the Pb in said piezoelectric ceramics is substituted by one or more rare earth elements.

10. The method of preparation of piezoelectric ceramics as claimed in claim 5, wherein not more than 20 at % of the Pb in said piezoelectric ceramics is substituted by one or more rare earth elements.

11. The method of preparation of piezoelectric ceramics as claimed in claim 4, wherein not more than 10 at % of the Ti in said piezoelectric ceramics is substituted by at least one selected from the group consisting of Mn, and Nb, and a mixture thereof.

12. The method of preparation of piezoelectric ceramics as claimed in claim 6, wherein not more than 10 at % of the Ti in said piezoelectric ceramics is substituted by at least one selected from the group consisting of Mn, and Nb, and a mixture thereof.

13. The method of preparation of piezoelectric ceramics as claimed in claim 4, wherein not more than 20 at % of the Pb in said piezoelectric ceramics is substituted by one or more rare earth elements.

14. The method of preparation of piezoelectric ceramics as claimed in claim 6, wherein not more than 20 at % of the Pb in said piezoelectric ceramics is substituted by one or more rare earth elements.

* * * * *